(12) United States Patent
Saito et al.

(10) Patent No.: US 6,343,162 B1
(45) Date of Patent: Jan. 29, 2002

(54) CONTACT TYPE IMAGE SENSOR AND INFORMATION PROCESSING APPARATUS

(75) Inventors: Oji Saito, Chigasaki; Kenji Nagata, Machida, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/220,070

(22) Filed: Dec. 23, 1998

(30) Foreign Application Priority Data

Dec. 25, 1997 (JP) ............................................. 9-357633

(51) Int. Cl.⁷ .............................. G06K 7/00; H04N 1/04
(52) U.S. Cl. ........................ 382/312; 358/482; 358/483
(58) Field of Search ........................ 382/312; 358/474, 358/475, 505, 513, 482, 483; 348/311, 332

(56) References Cited

U.S. PATENT DOCUMENTS

| | | | | |
|---|---|---|---|---|
| 5,163,117 A | * | 11/1992 | Imanishi | 385/120 |
| 5,254,847 A | | 10/1993 | Hata et al. | 250/208.1 |
| 5,489,995 A | | 2/1996 | Iso et al. | 358/483 |
| 5,514,888 A | * | 5/1996 | Sano | 257/232 |
| 5,627,364 A | * | 5/1997 | Codama | 250/208.1 |
| 6,115,187 A | * | 9/2000 | Tabata | 359/654 |

FOREIGN PATENT DOCUMENTS

| | | | |
|---|---|---|---|
| EP | 608932 A2 * | 3/1994 | ....... H01L/31/0216 |
| JP | 63303560 | 12/1988 | ............ H04N/1/04 |
| JP | 1089756 | 4/1989 | .......... H04N/1/028 |
| JP | 4135366 | 5/1992 | .......... H04N/1/028 |
| JP | 4249470 | 9/1992 | .......... H04N/1/028 |
| JP | 05-2472 | 1/1993 | .......... H04N/1/028 |
| JP | 05-20461 | 3/1993 | .......... H04N/1/028 |
| JP | 7-23172 | 1/1995 | .......... H04N/1/028 |

* cited by examiner

Primary Examiner—Jerome Grant
(74) Attorney, Agent, or Firm—Fitzpatrick, Cella, Harper & Scinto

(57) ABSTRACT

In a contact type image sensor having a sensor array mounting photosensors, a focussing unit for focussing light from an original upon the photosensors, and a frame for holding in position the sensor-array and focussing unit, the focussing unit abuts on the sensor array. In a contact type image sensor having a sensor array having a plurality of face-down sensor chips with a plurality of pixels mounted on a transparent substrate in line, a rod lens array for focussing light from an original, a light source for illuminating the original, and a frame for holding in position the sensor array, rod lens array, the transparent substrate is covered with a light shielding layer in an area other than an area on which the pixels of the sensor chips are mounted and an area corresponding to a focussing area of the rod lens array.

20 Claims, 14 Drawing Sheets

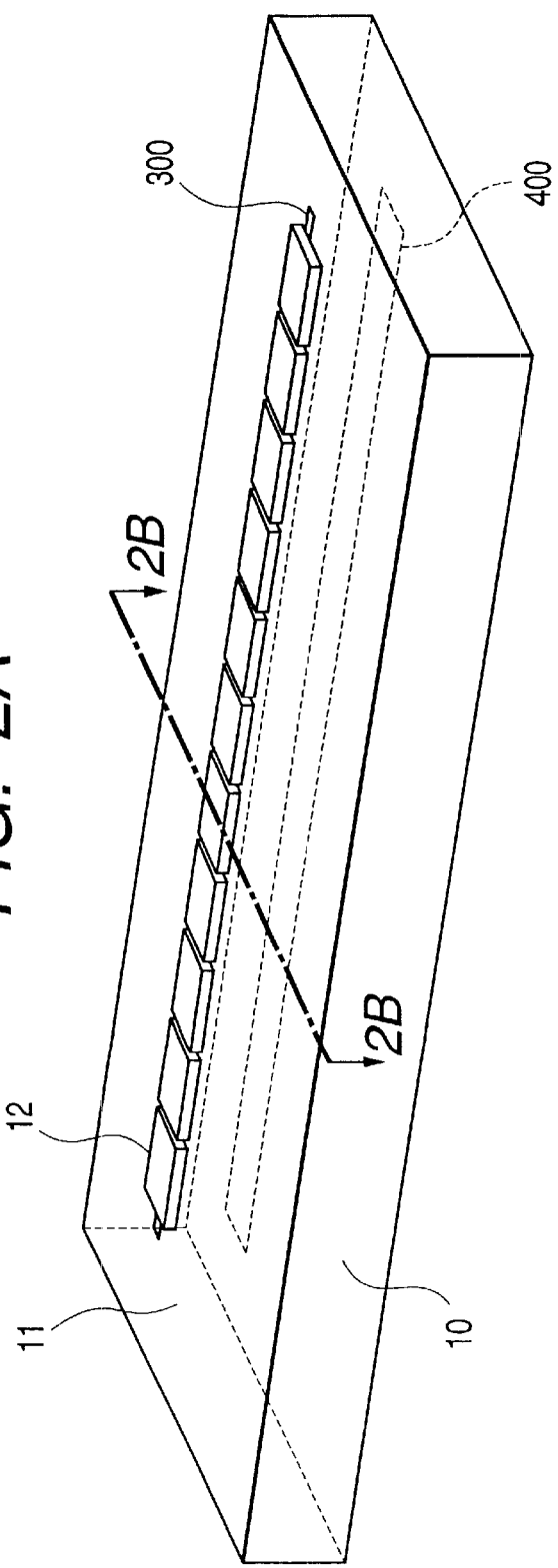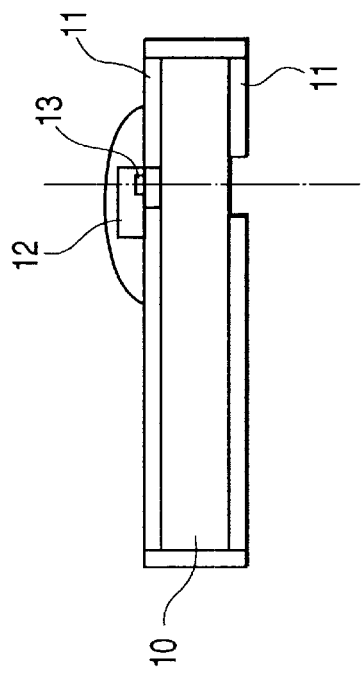

CONTACT TYPE IMAGE SENSOR AND INFORMATION PROCESSING APPARATUS

BACKGROUND OF THE INVENTION

1. Field of the Invention

The present invention relates to a contact type image sensor which reads an original from light reflected therefrom and can be used as an image pickup device of a facsimile, a copier, a scanner, and the like, and to an information processing apparatus using such a contact type image sensor.

2. Related Background Art

As an example of an original reader used with a facsimile, a copier, a scanner, or the like, a contact type image sensor is known which focusses an image of the original at a magnification factor of 1:1 and reads the image having the same size as the original with a sensor array. Such a contact type image sensor is constituted of: a sensor substrate formed with a plurality of sensor chips each having a plurality of pixels for photoelectric conversion and a protective film for protecting the sensor chips; a rod lens array for focussing an image of an original upon pixels of the sensor chips; and a cover glass defining an original reading surface, respectively mounted on a frame.

FIG. 15 is a schematic perspective view of a conventional contact type image sensor. Reference numeral 41 represents a frame for supporting the image sensor, and reference numeral 45 represents a transparent cover glass adapted to be in contact with an original and defining an original reading surface.

A plurality of optical sensors (pixels) are disposed along a longitudinal direction (main scan direction) DM of the frame 41, the shorter side direction DS being a sub-scan direction.

FIGS. 16A to 16C are cross sectional views showing the structures of different image sensors taken along line 17—17 in FIG. 15. Each image sensor shown in FIGS. 16A to 16C is constituted of: a light source 3 for illuminating an original; a rod lens array 2 disposed directly under an original reading surface of a cover glass 1; sensor chips 12; and a sensor substrate 18, respectively held in position by a frame 9. The image sensor shown in FIG. 16A has a bottom plate 8 integrally mounted on the frame 9 via a spacer 6. The image sensor shown in FIG. 16C has a transparent substrate 10 in place of the sensor substrate 18. In the image sensors shown in FIGS. 16A and 16B, a sensor array 19 is constituted of the sensor substrate 18 and sensor chips 12. A ceramic or glass epoxy substrate is used as the sensor substrate 18. After the sensor chips 12 are disposed on the substrate 18, wire bonding is performed to form the sensor array 19. The configuration of the frame 9 and the processing of the sensor substrate 18 have been determined so as to prevent stray light to be caused by external light and internally reflected light from entering sensor light reception areas. Other necessary components are also used for the image sensors shown in FIGS. 16A and 16B.

In the contact type image sensor shown in FIG. 16C, in place of the sensor substrate 18, the transparent substrate 10 such as a glass substrate with electrical wiring connections is used. The sensor array 19 is formed by mounting a plurality of face-down sensor chips 12 for photoelectric conversion in one line on the transparent substrate 10. High work precision of the image sensor has been set in order to prevent stray light to be caused by external light and internally reflected light from entering sensor light reception areas, more than the sensor arrays shown in FIGS. 16A and 16B.

FIG. 17 shows another example of the contact type image sensor shown in FIG. 15. A focussing unit 47 is disposed in a first space 41A of a frame 41. The focussing unit 47 has side plates 72 and 73 which allow a lens array of one or more lenses 71 to be disposed in rows. A light source 46 is disposed in a second space 41B. The light source 46 is constituted of: one or more LED light source units 63; a light guide plate 61 for guiding light from the light source along the main scan direction DM and illuminating an original PP; and a housing 62 for intercepting leak light from the light guide plate 61 and positioning the light guide plate 61 to efficiently illuminate the original PP.

The first and second spaces 41A and 41B communicate with each other. A sensor array 43 is mounted on an electrical circuit substrate 44 and is disposed between the frame 41 and a frame 42 as a second support, facing a third space 41C.

This image sensor is assembled in the following manner. The light source 46 is fixed to a mount plane 41D with adhesive or screws, and the focussing unit 47 is inserted into the first space 41A and fixed to a mount plane 41E with adhesive or screws.

The electric circuit substrate 44 with the sensor array 43 is fixed to the frame 41 by using the frame 42 or by using adhesive or screws.

With the above-described contact type image sensors, as shown in FIG. 18, in order to intercept a stray light beam 31 entering from a gap between a lens array and a frame, a stray light beam 32 entering from the bottom of each LED, and stray light beams entering from the sides and bottom of a sensor substrate, light interception walls are mounted on the frame, a gap is minimized with strict size precision, or other countermeasures are adopted. Therefore, components become complicated and bulky so that the assembly performance is degraded. Manufacture cost becomes high because of an increase in the number of components such as a bottom plate and an internal reflection preventing process.

In the case of a contact type image sensor such as shown in FIG. 16C which is formed by mounting a plurality of face-down sensor chips for photoelectric conversion in one line on a transparent substrate such as a glass substrate with electrical wiring connections, the merits of the transparent substrate become demerits because of entrance of stray light.

In order to further enhance and promote the compact structure and highest merit of the above-described contact image sensor, the following technical issues to be solved still exist.

(1) As the focussing unit 47 shown in FIG. 17 is made compact, the coating area of adhesive 49 for fixing the focussing unit 47 to the frame 41 becomes small. Therefore, it becomes difficult to coat the adhesive 49, or the adhesive may permeate into the surface of the focussing lens 71 to block the focussing optical path so that light information of the original PP into the sensor array 43 is intercepted to thus lower the image quality.

(2) If there is a variation in assembly works of inserting the focussing unit into the first space 41A and fixing it to the mount plane 41E, a position displacement of the focussing unit 47 from the mount plane 41E occurs so that the image quality is lowered.

SUMMARY OF THE INVENTION

An object of the present invention is to make compact a contact type image sensor. Another object of the invention is to improve an assembly performance of a contact type image sensor.

In order to achieve the above objects, according to one embodiment of the invention, there is provided a contact type image sensor comprising: a sensor substrate having photosensors mounted thereon; a focussing unit for focussing light from an original upon the photosensors; and a frame for holding the sensor substrate and the focussing unit, wherein the focussing unit abuts on the sensor substrate. With this embodiment, the contact type image sensor can be made compact.

According to another embodiment of the invention, there is provided a contact type image sensor comprising: photosensors; a support member for supporting an original; a focussing unit for focussing light from the original upon the photosensors; a frame for holding the photosensors, the focussing unit, and the transparent support member; and a focussing unit holding member disposed between the transparent support member and the focussing unit, for positioning the focussing unit relative to the frame. With this embodiment, the assembly works of the contact type image sensor become easy.

Other objects and aspects of the present invention will become apparent from the following detailed description of embodiments when read in conjunction with the accompanying drawings.

BRIEF DESCRIPTION OF THE DRAWINGS

FIGS. 2A and 2B are cross sectional views of a sensor array of the image sensor of the first embodiment.

DETAILED DESCRIPTION OF THE PREFERRED EMBODIMENTS

Figure 1:
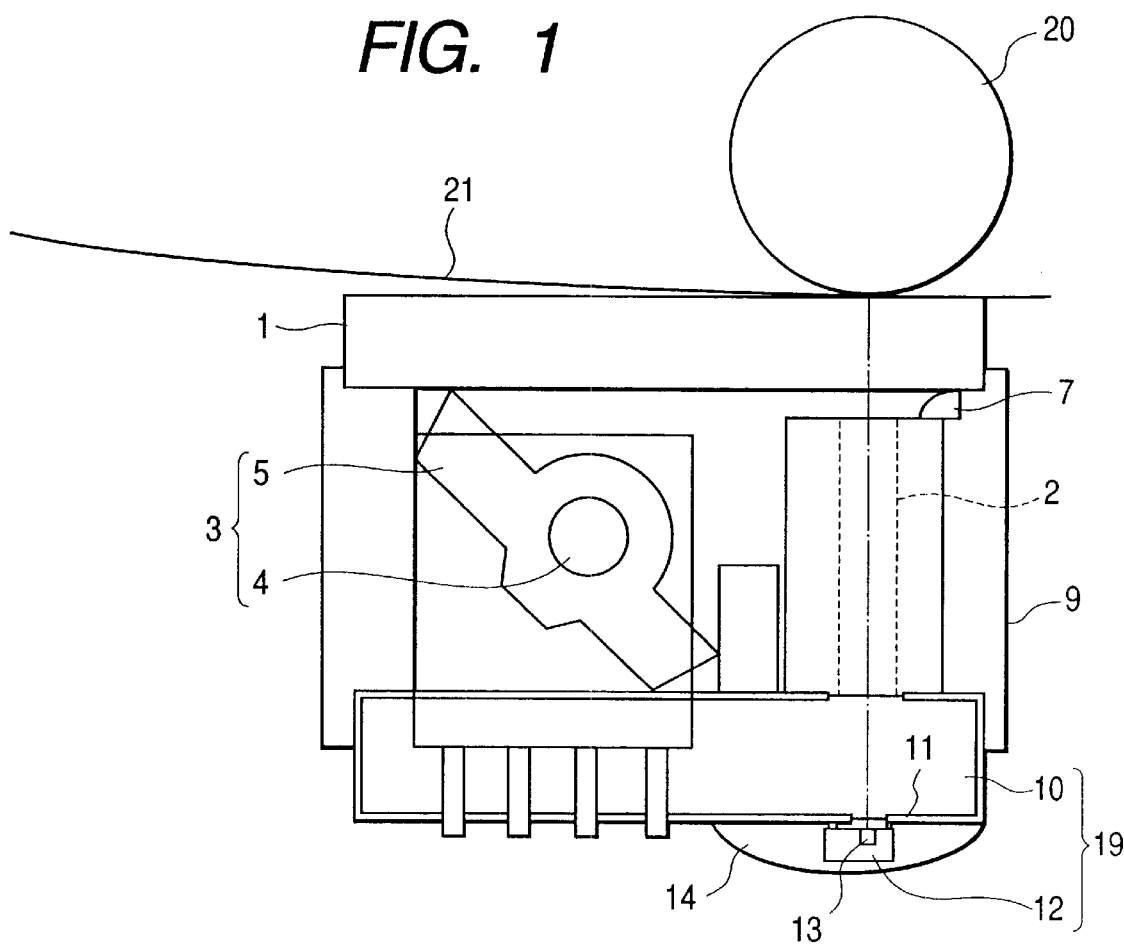
FIG. 1 is a cross sectional view of a contact type image sensor according to a first embodiment of the invention.

FIG. 1 is a cross sectional view of a contact type image sensor according to the first embodiment of the invention. In FIG. 1, reference numeral 1 represents a transparent cover glass plate on which an original is placed. Reference numeral 2 represents a rod lens array for guiding light reflected from an original. Reference numeral 3 represents a light source for illuminating an original. Reference numeral 4 represents a light emitting element such as LED serving as a light radiation unit of the light source 3. Reference numeral 5 represents a light guide plate for guiding light radiated from the light emitting element 4 along a longitudinal direction (main scan direction) and focussing the light upon an original reading point. Reference numeral 7 represents adhesive for bonding the cover glass plate 1 and rod lens array 2. Reference numeral 9 represents a frame of the contact type image sensor. Reference numeral 10 represents a light transmissive substrate disposed in contact with the bottom of the rod lens array 2 to hold it in position, and mounted with the image sensor including the light emitting element 4. Reference numeral 11 represents a light shielding layer which covers a surface area of the light transmissive substrate 10 on which components are not mounted, in order to eliminate stray light beams. Reference numeral 12 represents sensor chips for receiving light reflected from an original and transmitted through the rod lens array 2 and light transmissive substrate 10. Reference numeral 13 represents a light receiving area of each sensor chip 12. Reference numeral 14 represents a sealing/bonding resin for covering the sensor chips 12. Reference numeral 19 represents a sensor array including the light transmissive substrate 10 and sensor chips 12. Reference numeral 20 represents a roller for pressing an original 21 moved relative to the contact type image sensor, against the cover glass plate 1.

In this embodiment, since the rod lens array 2 as a focussing unit is aligned in position by abutting it on the light transmissive substrate 10, the contact type image sensor can be made compact in its thickness direction.

The contact type image sensor of this embodiment will be described more in detail. A plurality of face-down sensor chips 12 for photoelectric conversion are mounted in line and electrical wiring connections between the sensor chips and external terminals are formed. The light shielding layer 11 is made of black paint printed on the surface area of the light shielding substrate 10 except the areas corresponding to the light receiving areas of the plurality of sensor chips 12 and the area corresponding to the rod lens array 2. Unnecessary stray light beams can therefore be prevented from entering optical paths. The light shielding layer 11 may be a metal deposition film of aluminum or the like.

FIGS. 2A and 2B are diagrams showing the outline structure of the sensor array 19. The light shielding layer 11 is made of black paint printed on the surface area of the light shielding substrate 10 except the areas corresponding to light receiving areas 300 of the plurality of sensor chips 12 and the area corresponding to a light output area 400 of the rod lens array 2. The plurality of sensor chips 12 for photoelectric conversion are mounted in line in a face-down position to face the light receiving areas 300 toward the light transmissive substrate 10, and electrical wiring connections between the sensor chips and external terminals are formed. The total area of the light receiving areas 300 is smaller than the light output area 400.

Figure 3:
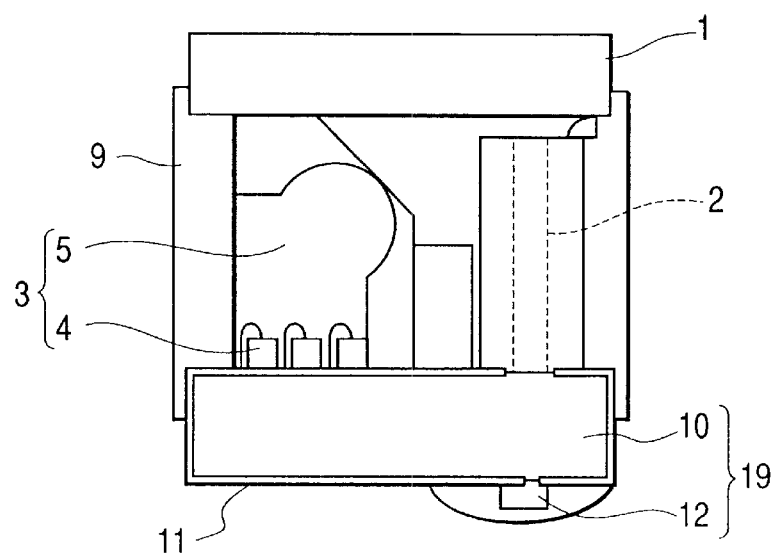
FIG. 3 is a cross sectional view of a contact type image sensor according to a second embodiment of the invention.

FIG. 3 is a cross sectional view of a contact type image sensor according to the second embodiment of the invention. A plurality of face-down sensor chips 12 for photoelectric conversion are mounted in line on a light transmissive substrate 10 and a light emitting element such as LED of a light source 3 and the like are mounted on the opposite surface of the light transmissive substrate 10, electrical wiring connections between these components being provided. Similar to the first embodiment, a light shielding layer 11 is made of black paint printed on the surface area of the light shielding substrate 10 made of, for example, glass, except the areas corresponding to light receiving areas 13 of the plurality of sensor chips 12 for receiving light from an original and the area corresponding to a light output area of a rod lens array 2. The light shielding layer 11 may be formed on the outer surface of a sealing/bonding resin 14 (refer to FIG. 1) and on the outer surface of the rod lens array 2 except the optical path area of light reflected from an original 21 (refer to FIG. 1).

Figure 4:
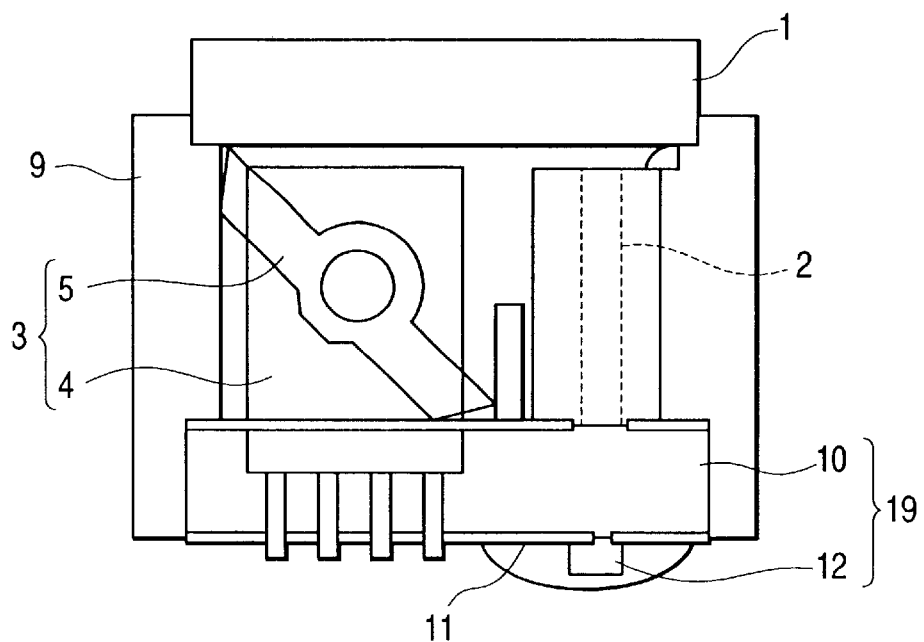
FIG. 4 is a cross sectional view of a contact type image sensor according to a third embodiment of the invention.

FIG. 4 is a cross sectional view of a contact type image sensor according to the third embodiment of the invention. In this contact type sensor array, a frame 9 is configured so as to perfectly shield light from opposite end surfaces of a sensor array 19. Light receiving areas for receiving light reflected from an original 21 are disposed on the surface of a light transmissive substrate 10 on the bonding side between the substrate 10 and sensor chips 12. A light shielding layer 11 is made of black paint printed on the surface area of the light shielding substrate 10 except the areas corresponding to the light receiving areas, the area corresponding to a light output area of a rod lens array 2 on the side opposite to the bonding side, and the opposite end surfaces of the sensor array 19. Also in this embodiment, unnecessary stray light beams can be prevented from entering optical paths. The light shielding layer 11 may be made of a metal deposition film such as aluminum.

Figure 5:
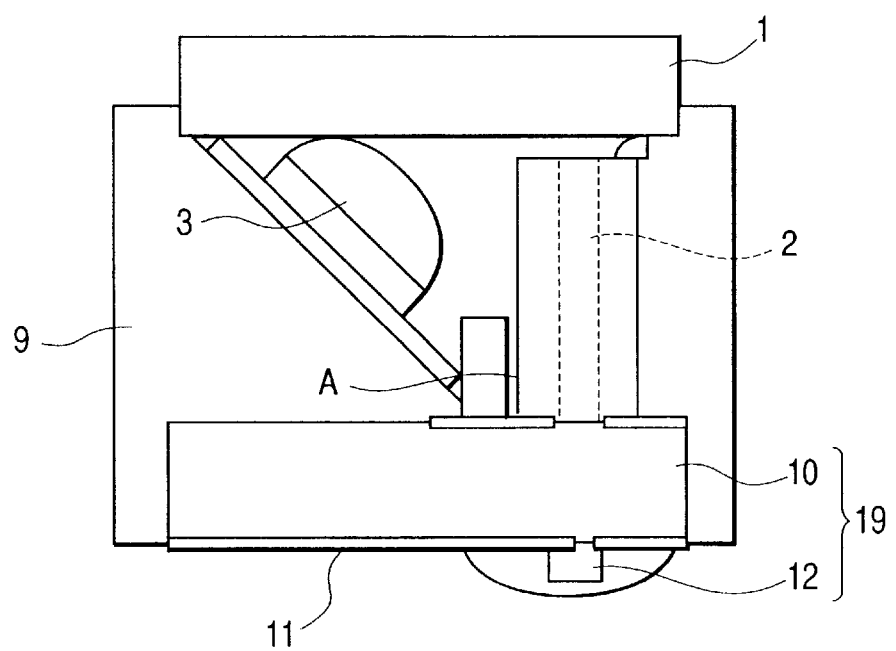
FIG. 5 is a cross sectional view of a contact type image sensor according to a fourth embodiment of the invention.

FIG. 5 is a cross sectional view of a contact type image sensor according to the fourth embodiment of the invention. This embodiment is applied to a contact type image sensor of the type that although a frame 9 is configured so as to perfectly shield light from opposite end surfaces of a sensor array 19, stray light from an original side cannot be eliminated perfectly (light entering a gap A on the side of a rod lens array 2). A light shielding layer 11 is made of black paint printed on the surface area of the light shielding substrate 10 except the areas corresponding to light receiving areas of sensor chips 12 for receiving light reflected from an original, the area, except a stray light entering area, corresponding to a light output area of a rod lens array 2 on the side opposite to the sensor chip side, and the opposite end surfaces of the sensor array 19. Also in this embodiment, unnecessary stray light beams can be prevented from entering optical paths. The light shielding layer 11 may be made of a metal deposition film such as aluminum.

Figure 6:
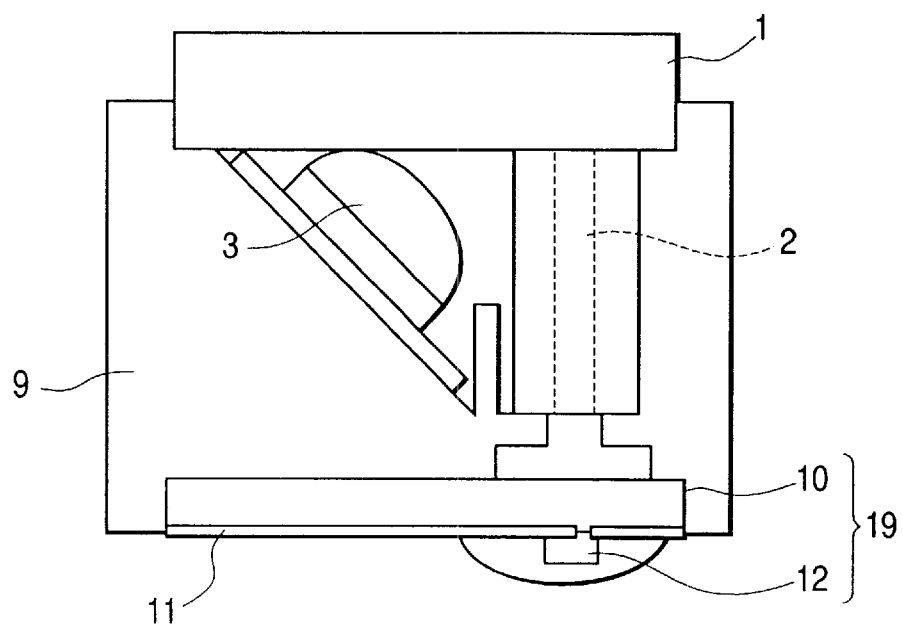
FIG. 6 is a cross sectional view of a contact type image sensor according to a fifth embodiment of the invention.

FIG. 6 is a cross sectional view of a contact type image sensor according to the fifth embodiment of the invention.

In this contact type image sensor, a plurality of face-down sensor chips 12 for photoelectric conversion are mounted in line on a light transmissive substrate 10 made of, for example, glass, and electrical wiring connections between the sensor chips and external terminals are formed. A frame 9, which aligns in position and holds a sensor array 19, a rod lens array 2 for focussing light from an original 21, a light source 3 for illuminating an original, and a cover glass 1 for supporting an original, can perfectly shield light from the opposite end surfaces of the sensor array 19 and also perfectly shield stray light from the original side. A light shielding layer 11 is made of black paint printed on only the surface area of the light shielding substrate 10 on the sensor chip side except the areas corresponding to light receiving areas of the sensor chips 12 for receiving light reflected from an original. Also in this embodiment, unnecessary stray light beams can be prevented from entering optical paths. The light shielding layer 11 may be also made of a metal deposition film such as aluminum.

Figure 7:
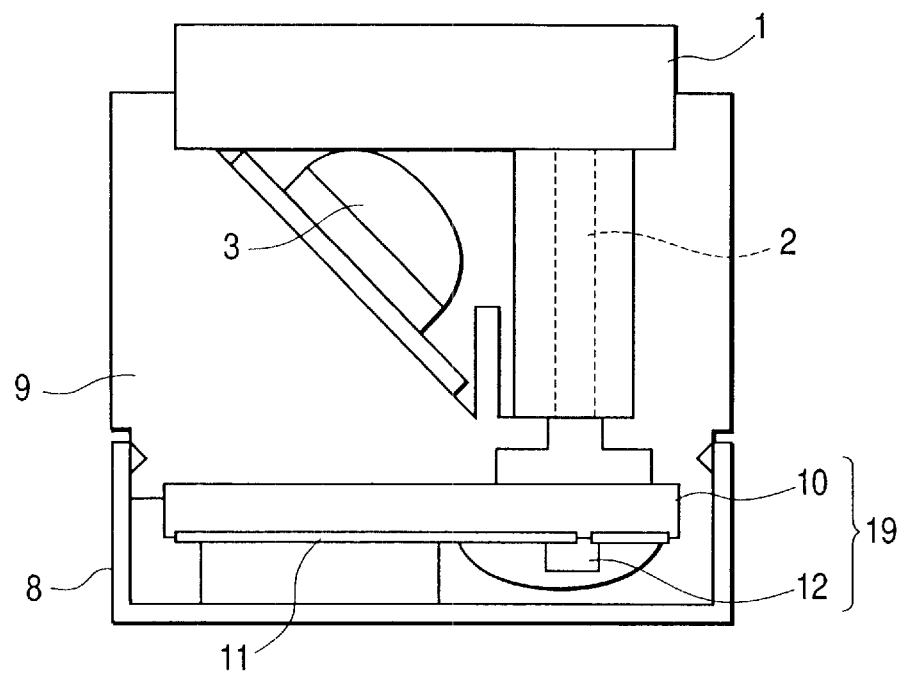
FIG. 7 is a cross sectional view of a contact type image sensor according to a modification of the fifth embodiment of the invention.

FIG. 7 shows a modification of the fifth embodiment. In this contact type image sensor, a frame 9 can perfectly shield stray light on the original side entering from a glass plate and a combination of the frame 9 and a bottom plate 8 can perfectly shield stray light such as external light. A light shielding layer 11 is made of black paint printed on only the surface area of the light shielding substrate 10 on the sensor chip side except the areas corresponding to light receiving areas of the sensor chips 12 for receiving light reflected from an original. Also in this embodiment, unnecessary stray light beams can be prevented from entering optical paths, even if the frame 9 and bottom plate 8 are not subject to an internal irregular reflection preventing process.

Figure 19:
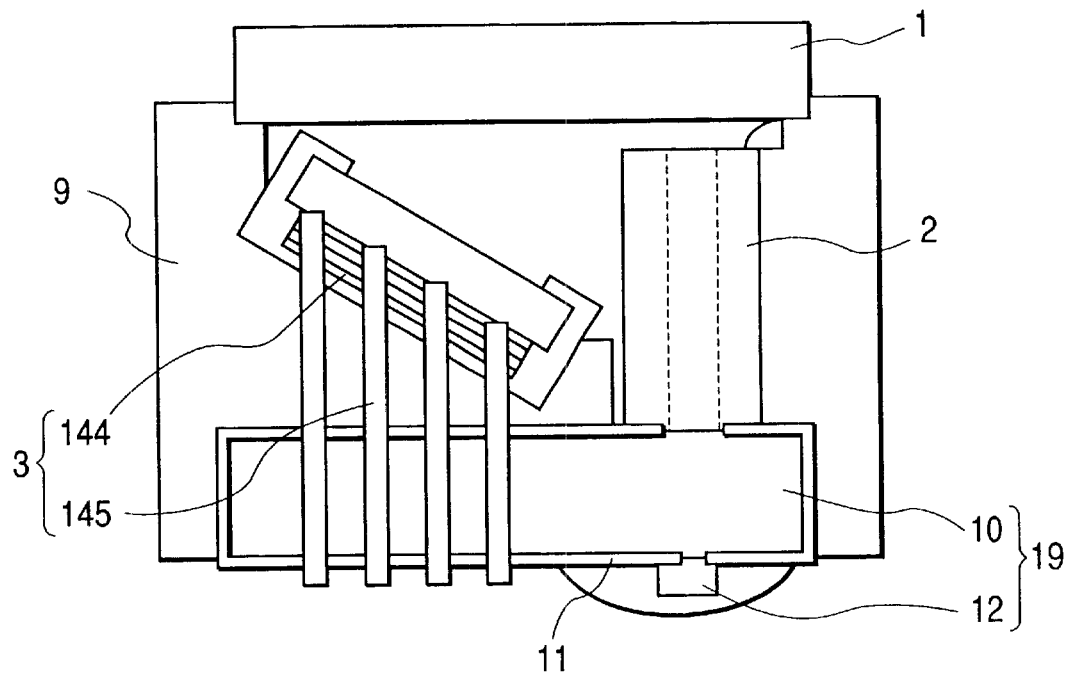
FIGS. 19, 20, 21 and 22 are cross sectional views of modified embodiments of the contact type image sensor of the first embodiment of the present invention.
Figure 20:
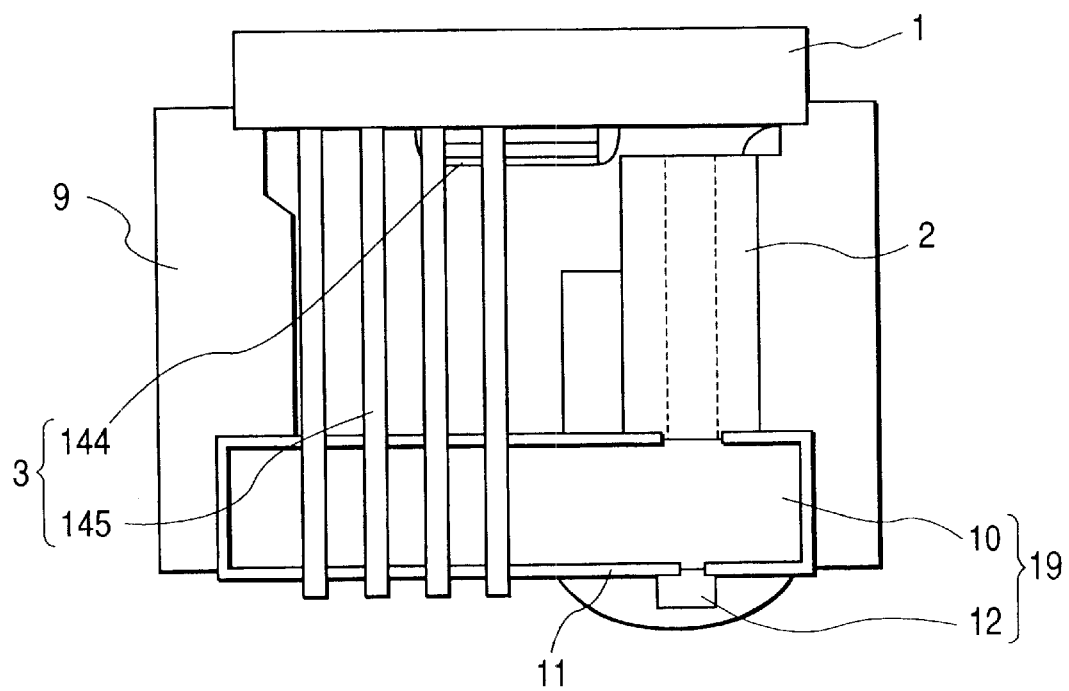
Figure 21:
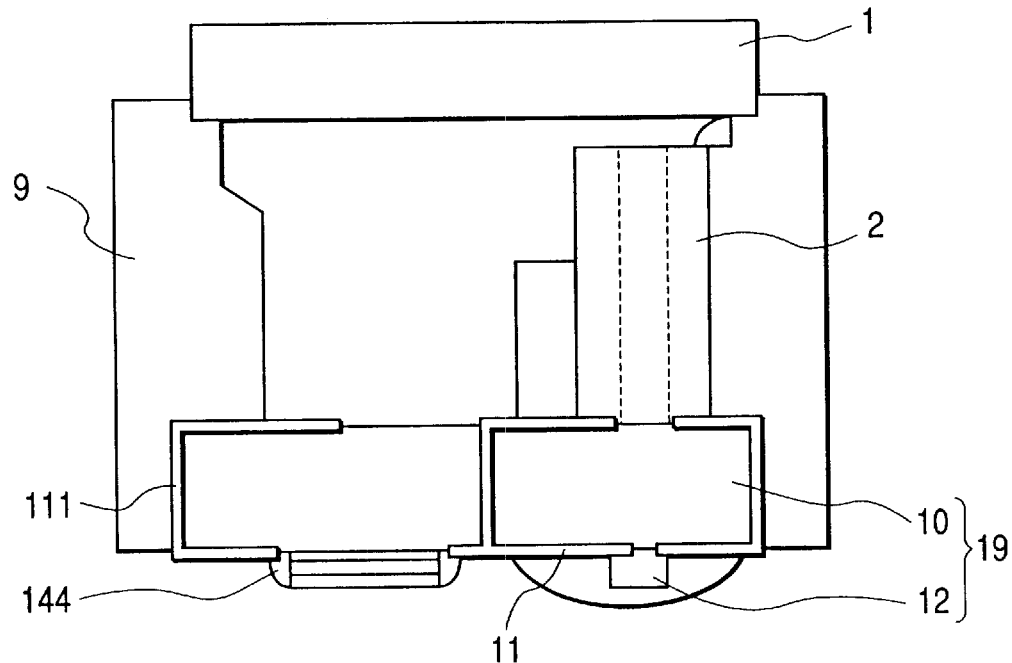
Figure 22:
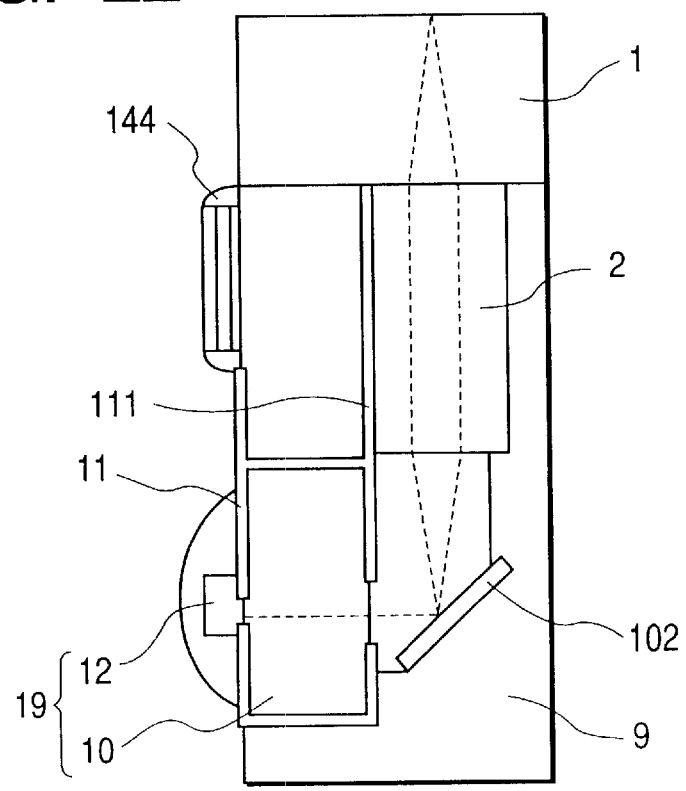

In the above-described embodiment, the LED is used as the light source. However, electroluminescence (EL) may be also used as the light source. Each of FIGS. 19 to 22 shows such an embodiment where the EL is used as the light source. FIG. 19 shows an embodiment where an EL light source 144 of an array type is used. FIG. 20 shows an embodiment where the EL light source 144 is arranged on a back surface of a cover glass 1. FIG. 21 shows an embodiment where the EL light source 144 is arranged on the same surface as the surface on which the sensor 12 of the light transmissive substrate 10, which is a portion of the sensor array, is arranged. FIG. 22 shows an embodiment where the EL light-source 144 is arranged on the same surface as the surface the sensor 12 of the light transmission substrate 10 is arranged and wherein a reflection mirror 102 is arranged to switch an optical path within the image sensor and thereby attain the contact type image sensor of smaller size. Accordingly to the embodiments shown in FIGS. 19 to 22, in which the EL is used as the light source, it can be attained to reduce the size of the contact type of the image sensor.

Figure 8:
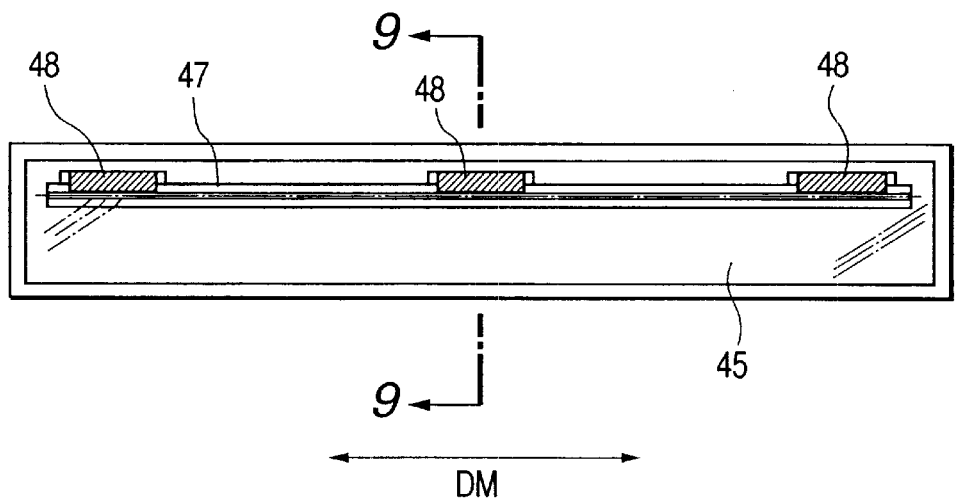
FIG. 8 is a plan view of a contact type image sensor.
Figure 9:
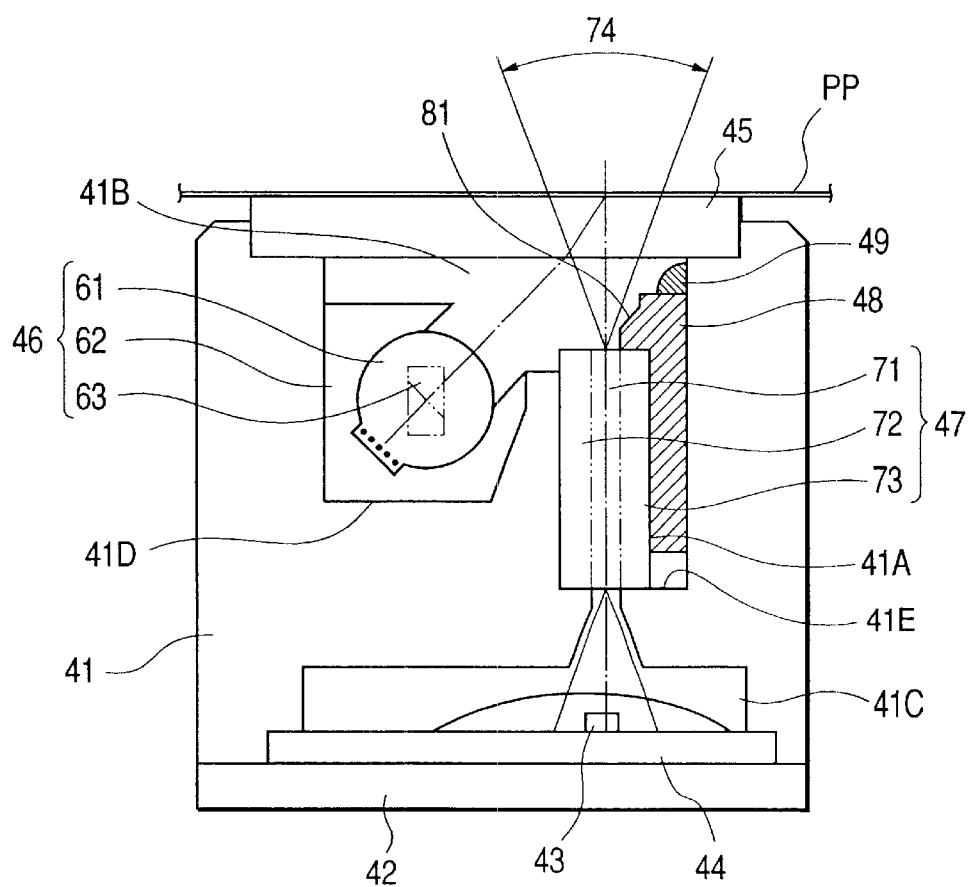
FIG. 9 is a cross sectional view taken along line 9—9 of FIG. 8.
Figure 15:
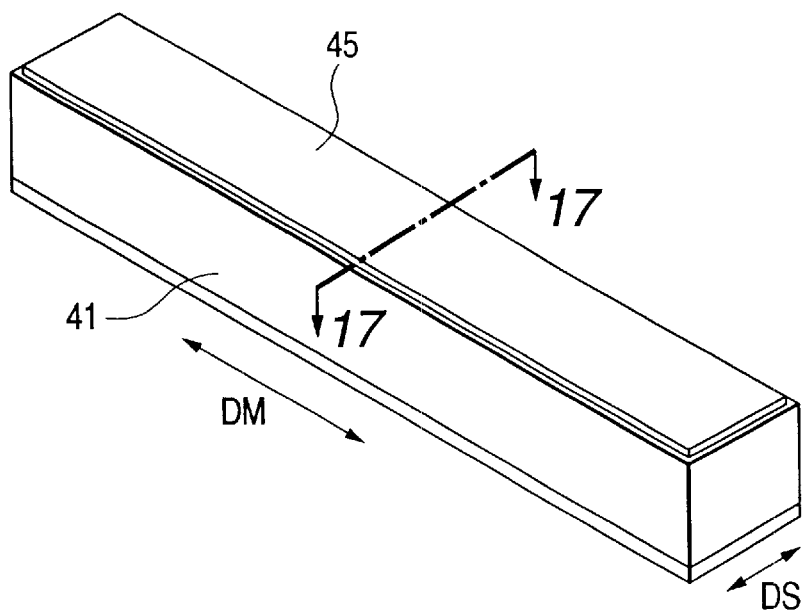
FIG. 15 is a schematic perspective view of a contact type image sensor according to related art.
Figure 17:
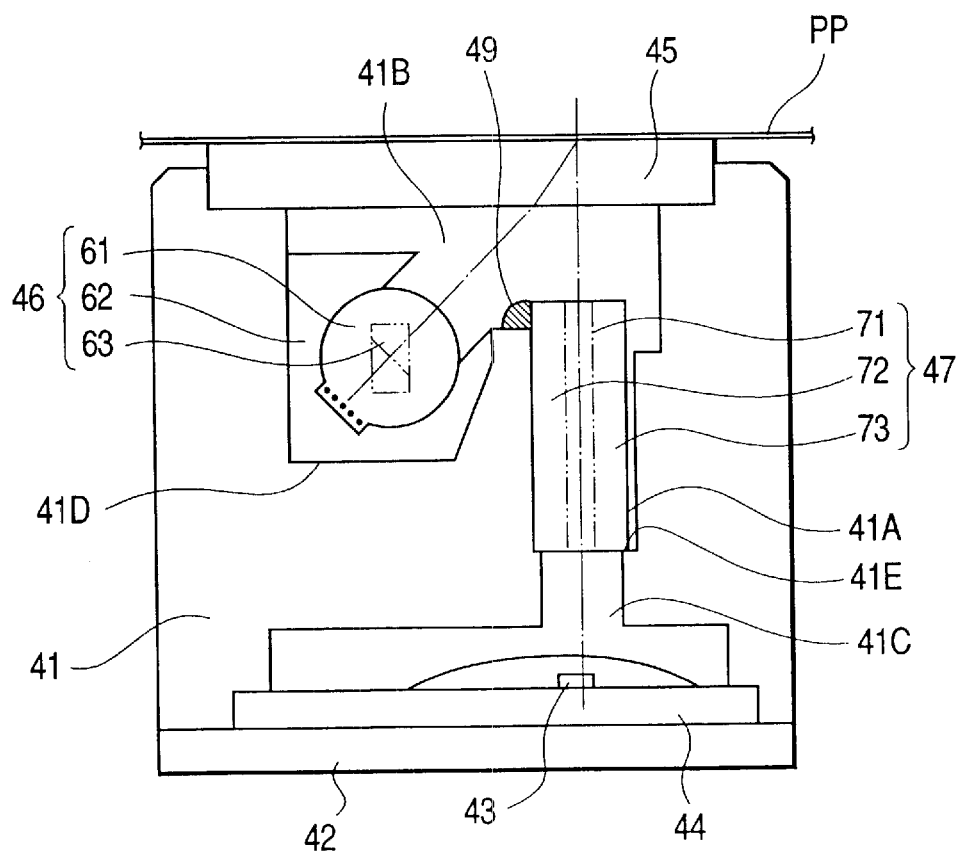
FIG. 17 is a cross sectional view taken along line 17—17 in FIG. 15.
Figure 16A:
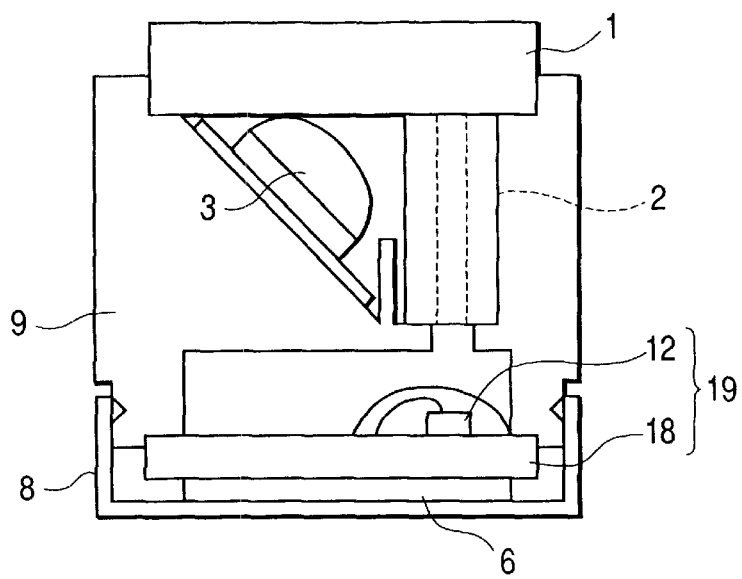
FIGS. 16A, 16B and 16C are cross sectional views of typical contact type image sensors.
Figure 16B:
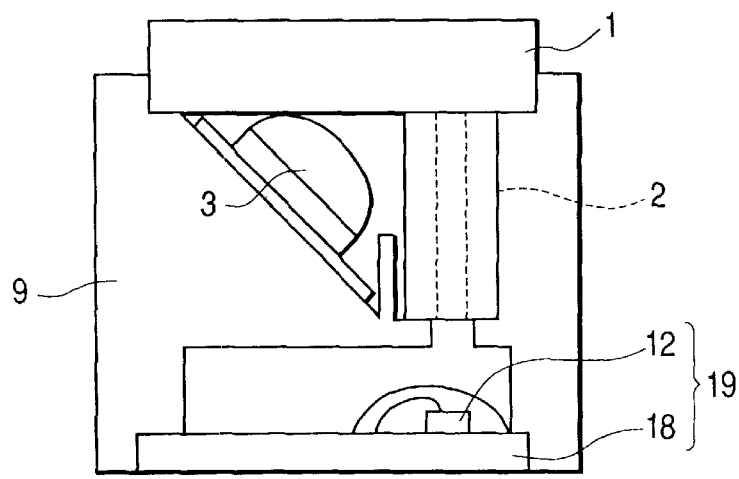
Figure 16C:
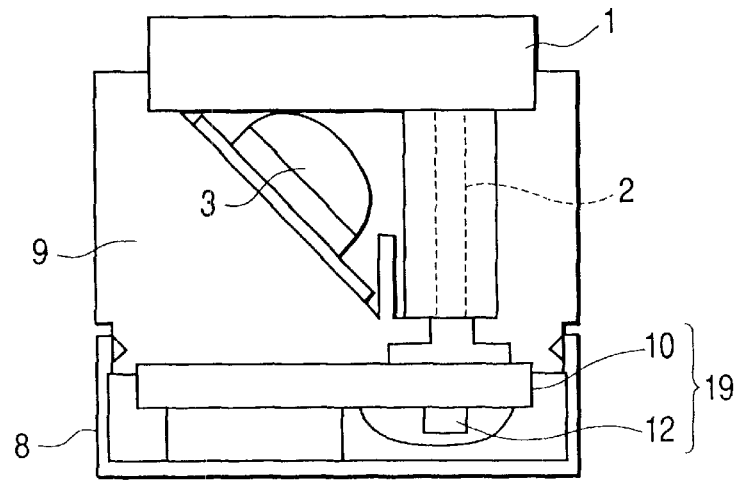
Figure 18:
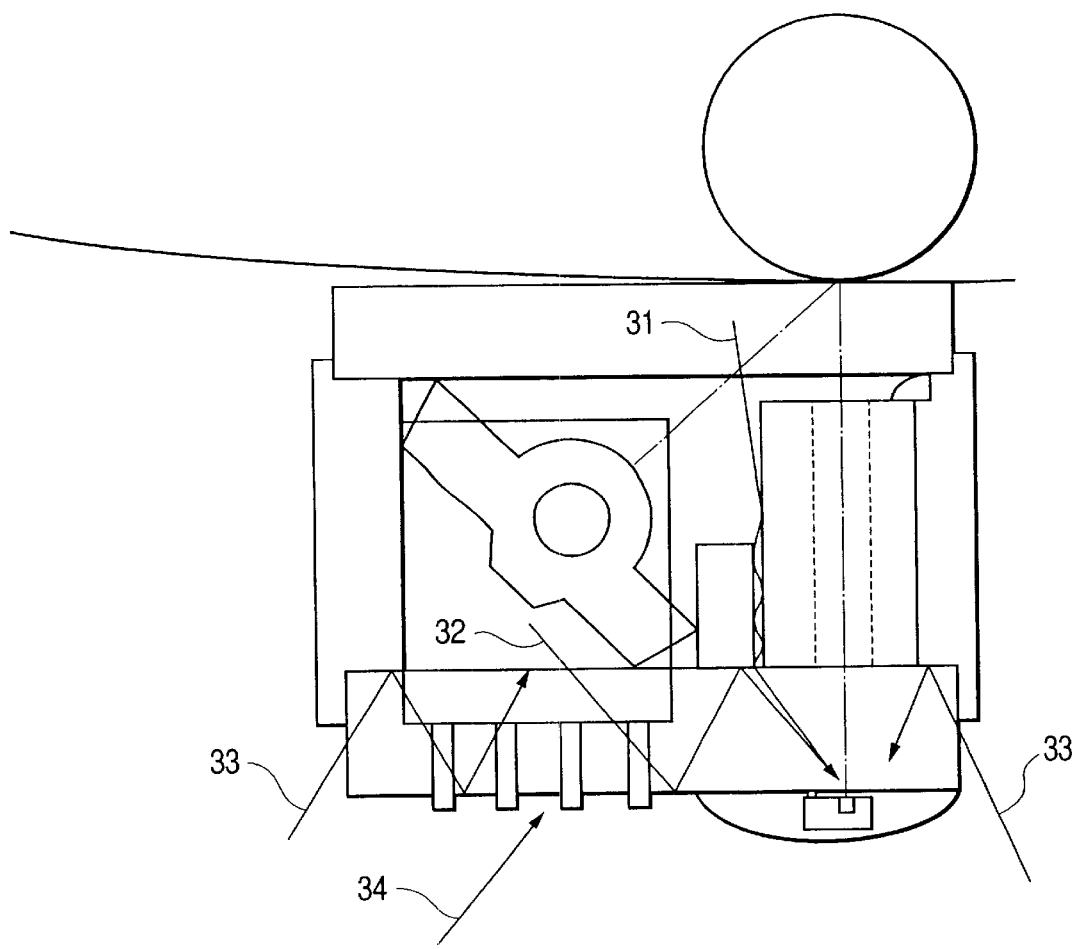
FIG. 18 is a diagram showing typical stray light entrance paths.

FIGS. 8 and 9 are a plan view and a cross sectional view specifically illustrating the features of a contact type image sensor according to the sixth embodiment of the invention. FIG. 8 is a plan view of the contact type image sensor as viewed from an original reading surface of a transparent member 45 in contact with an original PP, and particularly shows the positions in a longitudinal direction DM of focussing unit holding members 48 for holding a focussing unit 47 for focussing light onto image sensors 43, the light entering via the transparent member 45 such as a glass plate from an original. The focussing unit holding members 48 hold the focussing unit 47 at a plurality of positions thereof, by using a frame 41. Like elements to those shown in FIGS. 15 and 17 are represented by using identical reference numerals, and duplicate description is omitted. FIG. 9 is a cross sectional view taken along line 9—9 of FIG. 8.

Referring to FIG. 9, a focussing unit 47 is disposed in a first space 41A of a frame 41. The focussing unit 47 has side plates 72 and 73 which allow a lens array of one or more lenses 71 to be disposed in rows. A light source 46 is disposed in a second space 41B. The light source 46 is constituted of: one or more LED light source units 63; a light guide plate 61 for guiding light from the light source along the main scan direction DM and illuminating an original PP; and a housing 62 for intercepting leak light from the light guide plate 61 and positioning the light guide plate 61 to efficiently illuminate the original PP.

The first and second spaces 41A and 41B communicate with each other. The sensor array 43 is mounted on an electrical circuit substrate 44 and is disposed between the frame 41 and a frame 42 as a bottom plate of a second support, facing a third space 41C.

This image sensor is assembled in the following manner. The light source 46 is fixed to a mount plane 41D of the frame 41 with adhesive or screws, the focussing unit 47 is inserted into the first space 41A and abutted on a mount plane 41E, and the focussing unit holding members 48 are inserted into the space between the frame 41 and focussing unit 47 and fixed to the frame 41 with adhesive or screws.

The electric circuit substrate 44 with the sensor array 43 is fixed to the frame 41 by using the bottom frame 42 or by using adhesive or screws.

Also referring to FIG. 9, the focussing unit 47 is held in position by being squeezed by the frame 41 and focussing unit holding member 48. The focussing unit holding member 48 is colored black same as the frame 41. The side wall 73 constituting the focussing unit 47 on the side opposite to the light source 46 abuts on the focussing unit holding member 48 which is fixed to the frame 41 with adhesive 49.

A method of fixing the focussing unit holding member 48 to the frame 41 is not limited only to the above-described method. For example, convex and concave hooks may be provided to engage the focussing unit holding member 48 with the frame 41, or a pressure boss may be provided to either the focussing unit holding member 48 or the frame 41 to pressure-fix them.

A surface 81 of a projecting portion of the focussing unit holding member 48 pressing downward the focussing unit 47 in a thickness direction or focussing optical path direction (up/down direction in FIG. 9) extends outward relative to a focussing opening angle 74 of the focussing unit 47. The focussing opening angle 74 defines a range allowing light reflected from an original PP to be received.

Referring to FIG. 8, the focussing unit 47 is held in position by being squeezed between the focussing unit holding members 48 and frame 41 at a middle and opposite end positions along the longitudinal direction DM. The number of positions where the focussing unit 47 is held may be one or more along the longitudinal direction, or the focussing unit 47 may be held over its whole length.

With the structure of the sixth embodiment, the following advantages can be obtained.

(1) Since the focussing unit 47 is positioned and squeezed between the frame 41 and focussing unit holding members 48, a position displacement of the focussing unit 47 to be caused by a variation in assembly works can be managed by a component dimension precision of the frame 41. Therefore, an image quality can be improved and a clear image can be maintained.

(2) Since the focussing unit 47 is fixed by fixing the focussing unit holding member 48 to the frame 41 with the adhesive 49, the adhesive 49 is prevented from being attached to the focussing unit 47 and the focussing lens 71 will not be made dirty by the adhesive 49. It is therefore possible to solve a problem of a poor image quality by preventing a focussing optical path from being shielded and preventing light information to image sensors from being cut.

Abutting the focussing unit holding member 48 only upon the side wall 73 without covering the focussing lens 71 of the focussing unit 47 can be managed by a component dimension precision of the focussing unit holding member 48. It is therefore possible to solve a problem of a poor image quality by preventing a focussing optical path from being shielded and preventing light information to image sensors from being cut.

(3) The focussing unit holding member 48 is colored black same as the frame 41, the black absorbing light and suppressing reflection light. It is therefore possible to solve a problem of a poor image quality by suppressing internal reflection light of the sensor array 43 and making uniform the internal reflection light.

Further, the surface 81 of a projecting portion of the focussing unit holding member 48 pressing downward the focussing unit 47 in a thickness direction or focussing optical path direction extends outward relative to the focussing opening angle 74 of the focussing unit 47. Since the surface 81 is retracted from a range allowing light reflected from an original to be received, an image quality can be prevented from being degraded by internal reflection light.

In the sixth embodiment, similar to the first to fourth embodiments, a light shielding layer may be formed on an area surrounding the image sensors 43 on an electric circuit substrate 44 and on an area of the third space 41C between the frames 41 and the bottom frame 42 as the second support. In this manner, stray light other than image signal light from the frame 41 can be shielded so that only reflection light guided by the focussing unit 47 can be received with the image sensors 43 and an image signal having a clear and high contrast can be obtained.

Figure 10:
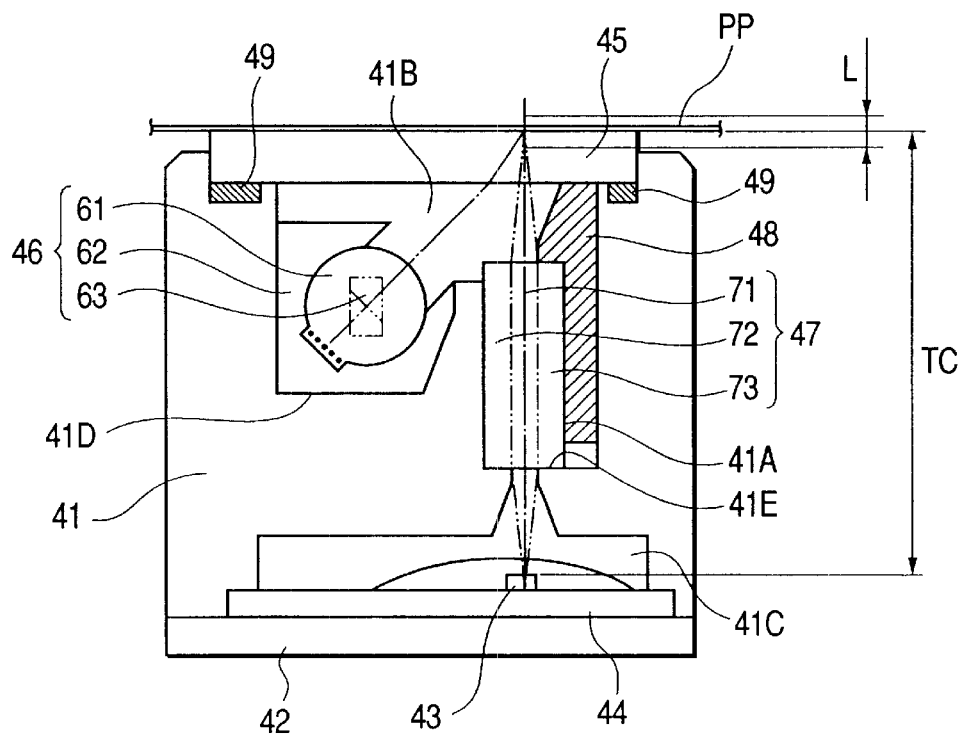
FIG. 10 is a cross sectional view of a contact type image sensor according to a seventh embodiment of the invention.

FIG. 10 is a cross sectional view of a contact type image sensor according to the seventh embodiment of the invention. Referring to FIG. 10, a focussing unit holding member 48 abuts on a focussing unit 47 and on a transparent member 45 in contact with an original PP moving relative to the image sensor. A focussing optical path thickness of the focussing unit holding member 48 between the transparent member 45 and focussing unit 47 is set so that the surface of the transparent member 45 in contact with an original PP is positioned at the focal length TC of the focussing unit 47 in a range of a depth L of focus.

The focussing unit 47 is squeezed between the frame 41 and the transparent member 45 via the focussing unit holding member 48 along the focussing optical path direction. While the focussing unit 47 is pressed down, the transparent member, 45 is adhered to, the frame 41 so that the focussing unit 47 is fixed.

With this structure, the mount position of the focussing unit 47 can be controlled by the component dimension precision of the focussing unit holding member 48 and frame 41. A position displacement of the focussing unit 47 from a mount position 41E to be caused by a variation in assembly works can be suppressed so that a problem of degraded image clearness can be solved.

Since the focussing unit 47 is held in position by the process of fixing the transparent member 45, the assembly process can be simplified and the number of assembly processes can be reduced.

Figure 11:
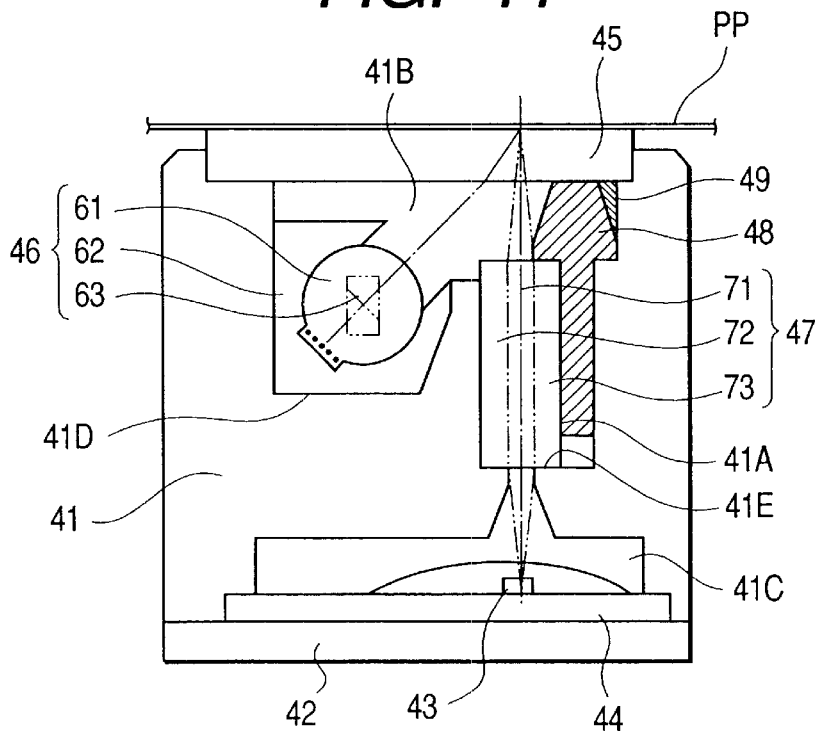
FIG. 11 is a cross sectional view of a contact type image sensor according to an eighth embodiment of the invention.

FIG. 11 is a cross sectional view of a contact type image sensor according to the eighth embodiment of the invention. Referring to FIG. 11, a portion of a focussing unit holding member 46 abutting on a focussing unit 47 and on a transparent member 45 has a symmetrical shape along its longitudinal direction as viewed in the cross section. The focussing unit holding member 48 is a solid having an arrow shape. A frame 41 abuts on the top surface of the focussing unit 47 and the bottom of the arrowhead of the focussing unit holding member 48, and the transparent member 45 abuts on the top flat surface of the arrowhead of the focussing unit holding member 48 and is fixed with adhesive 49.

With this structure, the assembly direction of the focussing unit holding member 48 becomes omnidirectional so that the assembly process can be simplified and the number of assembly processes can be reduced.

Figure 12:
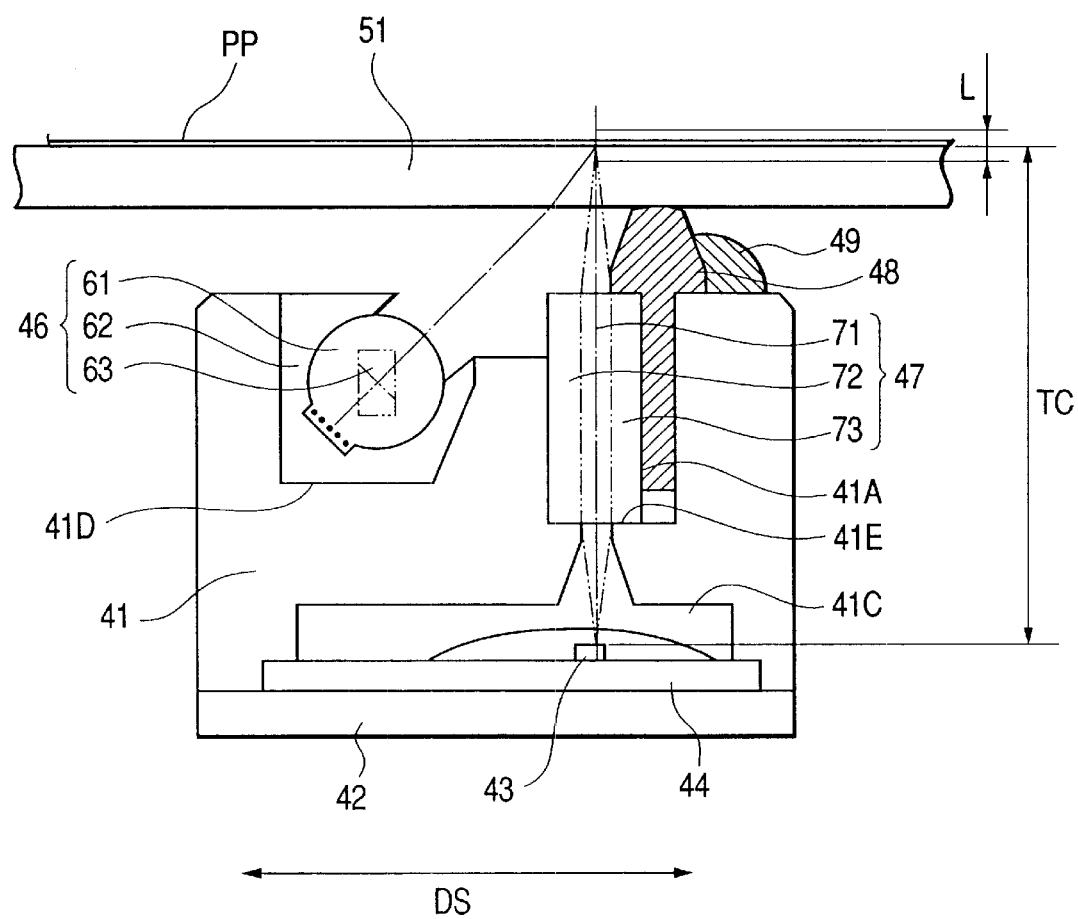
FIG. 12 is a cross sectional view of a flat bed type image sensor according to a ninth embodiment of the invention.

FIG. 12 is a cross sectional view of a flat bed type image scanner used as an information processing apparatus according to the ninth embodiment of the invention.

Referring to FIG. 12, the flat bed type image scanner is structured so that an original PP is read while a contact type image sensor moves relative to a transparent member 51 in contact with the original PP. A focussing unit 47 is squeezed between a frame 41 and a focussing unit holding member 48. The focussing unit 47 is held in position by fixing the focussing unit holding member 48 to the frame 41 with adhesive 49.

The focussing unit holding member 48 abuts on the transparent member 51 and focussing unit 47. A focussing optical path thickness of the focussing unit holding member 48 between the transparent member 51 and focussing unit 47 is set so that the surface of the transparent member 51 in contact with an original PP is positioned at the focal length TC of the focussing unit 47 in a range of a depth L of focus.

With this flat bed type image scanner, the contact type image sensor can move along a DS direction while the focussing unit holding member 48 abuts on the transparent member 51. The material of the focussing unit holding member 48 is mold resin having good slide and antifriction characteristics.

With this structure of the flat bed type image scanner, a position displacement of the focussing unit 47 to be caused by a variation in assembly works can be suppressed so that a problem of degraded image clearness can be solved. The focussing lens 71 will not be made dirty by adhesive so that it is possible to solve a problem of a poor image quality. It is also possible to set the contact type image sensor at a proper position relative to the read surface of the transparent member 51 during an original scan operation.

Figure 13:
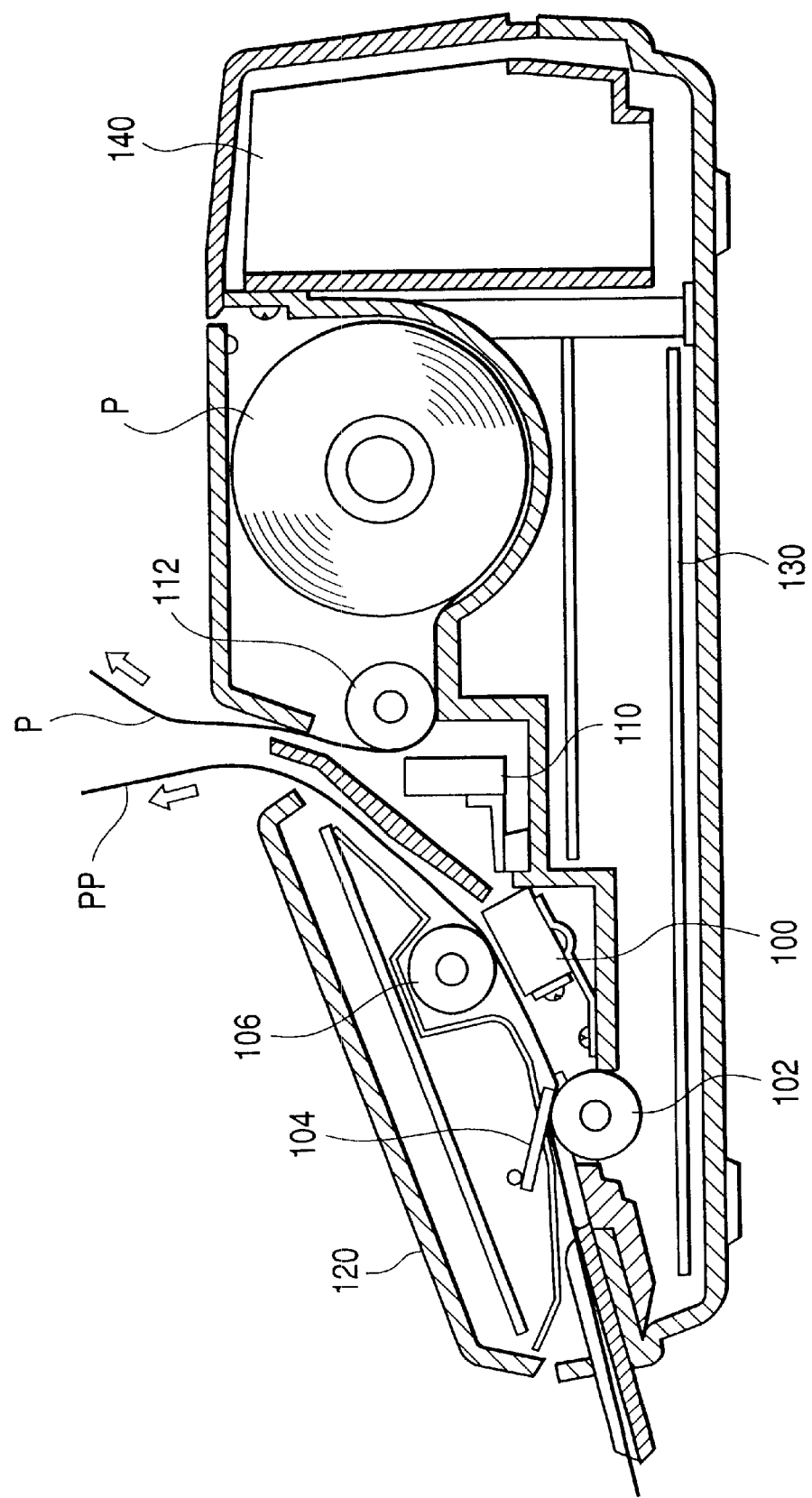
FIG. 13 is a schematic cross sectional view of an image information processing apparatus using a flat bed type image sensor according to a tenth embodiment of the invention.

FIG. 13 is a cross sectional view of a facsimile with a communication function used as an image information processing apparatus having a contact type image sensor unit 100, according to the tenth embodiment of the invention. In FIG. 13, reference numeral 102 represents a paper feed roller as feeding means for feeding an original PP to a read position, and reference numeral 104 represents a separation piece for reliably separating originals PP one piece after another. Reference numeral 106 represents a platen roller as transport means disposed at the read position and facing the sensor unit 100 for regulating the position of the read surface of the original PP and transporting the original PP. The sensor unit 100 is the contact type image sensor of any one of the above-described embodiments and has a transparent member such as a glass plate on the surface thereof in contact with the original PP. Light reflected from the original PP is read with the sensor unit via a focussing unit to thereby read an image of the original PP.

Reference symbol P represents a recording medium such as paper in a roll. Image information read with the sensor unit or image information transmitted from an external apparatus is reproduced and recorded on the recording medium. Reference numeral 110 represents a recording head as recording means for forming an image, reference numeral 112 represents a platen roller as transport means for transporting the recording medium P to a record position of the recording head 110 and regulating the position of a record surface of the recording medium P.

Reference numeral 120 represents an operation panel having switches as input/output means, a display for displaying a message or a state of partner apparatuses, and the like. Reference numeral 130 represents a system control board as control means.

The system control board 130 is provided with: a control unit for controlling every units constituting the facsimile; drive circuits for a light source of the contact type image sensor 100 and for photoelectric conversion elements; an image processing unit for performing predetermined processes for image information supplied from the image sensor; a transmission/reception unit for transmitting image information processed by the image processing unit to a partner apparatus and supplying image information received from a partner apparatus to the image processing unit; and the like. Reference numeral 140 represents a power source of the facsimile. The drive circuits, image processing unit, and transmission/reception unit are controlled by the control unit.

Figure 14:
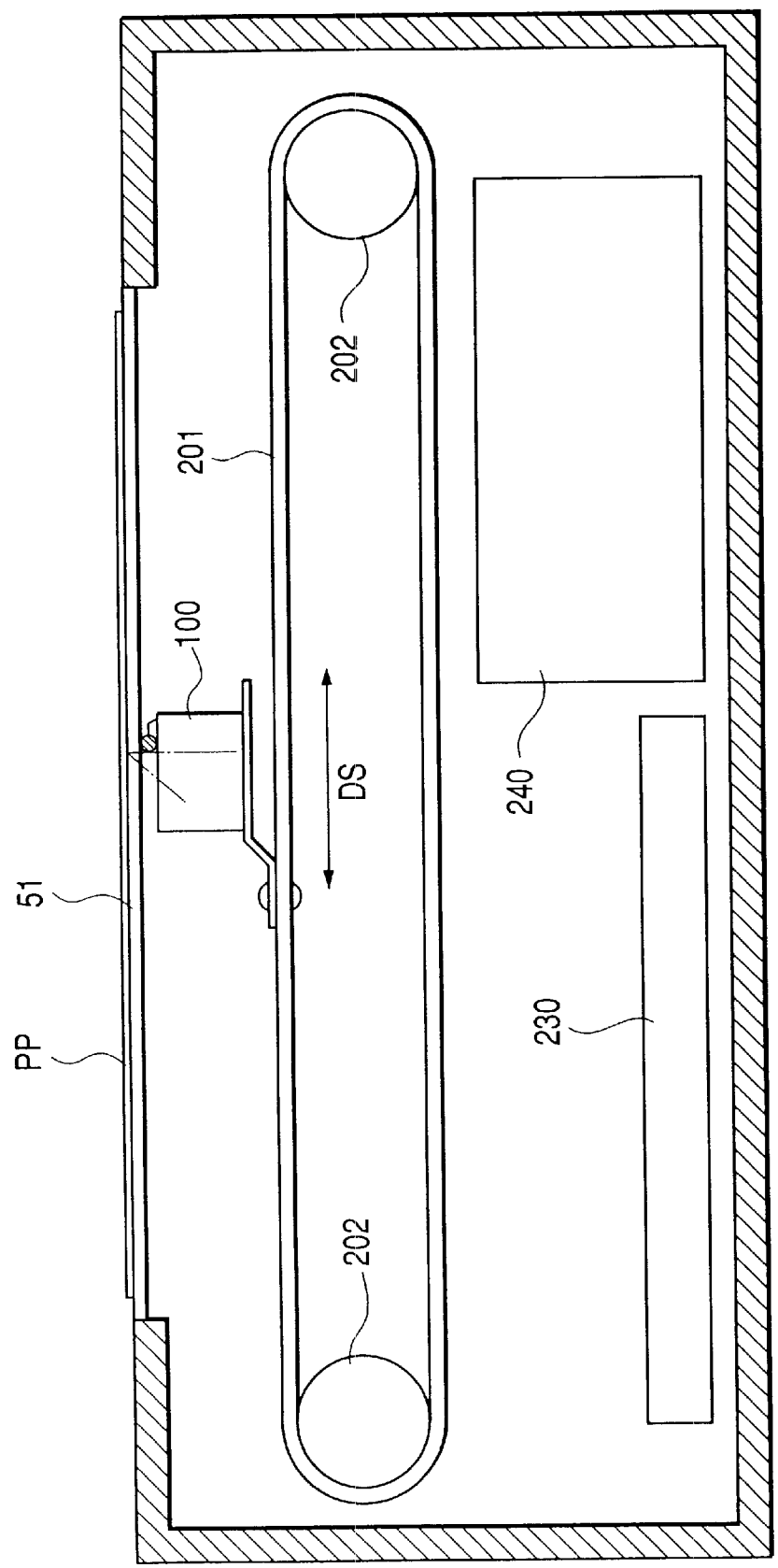
FIG. 14 is a schematic cross sectional view of an image information processing apparatus using the flat bed type image sensor of the tenth embodiment.

FIG. 14 is a cross sectional view of a flat bed type image scanner as an image information processing apparatus using the contact type image sensor unit 100 of the tenth embodiment. Reference numeral 51 represents a transparent member for defining a read surface in contact with an original PP. Reference numeral 201 represents a scanning belt as feed means for mounting the sensor unit 100 and scanning it in a scan direction DS. Reference numeral 202 represents a feed roller for driving the scanning belt 201. Reference numeral 230 represents a system control board as control means. The system control board 230 is provided with: a control unit for controlling every units constituting the image scanner; drive circuits for a light source of the contact type image sensor 100 and photoelectric conversion elements; an image processing unit for performing predetermined processes for image information supplied from the image sensor 100; a transmission/reception unit for transmitting image information processed by the image processing unit to a partner apparatus and receiving various commands from a partner apparatus; and the like. Reference numeral 240 represents a power source of the image scanner. The drive circuits, image processing unit, and transmission/reception unit are controlled by the control unit. The sensor unit 100 moves in the sub-scan direction of the scanning belt relative to the original PP placed on the flat bed type transparent member 51 and reads one line in the main scan direction or depth direction of FIG. 14 to thereby read an image of the original in the read surface area. The sensor unit 100 is scanned while a focussing unit holding member 48 described with reference to FIG. 12 is moved in contact with the transparent member 51. Light reflected from the original PP is received with a line image sensor or sensor unit 100 via a focussing unit and converted into an image signal. The image signal is subject to the image signal process by the system control board 230 and is output to an external signal processing apparatus.

Both the light shielding layer described in the first to fourth embodiments and the focussing unit holding member for positioning and fixing the focussing unit described with the fifth to eighth embodiments are provided to obtain synergetic effects thereof.

As described so far in each of the embodiments, the focussing unit for focussing light from an original upon sensor chips of the sensor array abuts on the sensor array. Accordingly, the contact type image sensor can be made light and compact, and in particular the image sensor can be made thin.

Further, the transparent substrate is covered with the light shielding layer in an area except the area corresponding to the light reception areas of the sensor chips and the area corresponding to the focussing area of the rod lens array. It is therefore possible to prevent leak light into the sensor chips and it is not necessary to shield the stray light entering paths with the structure of the frame or with other components. Accordingly, the degree of freedom of shapes of the components can be broadened, the number of components can be reduced, the image sensor and apparatuses using the image sensor can be made light and compact, and an application field of a face-down mounted sensor array can be expanded.

Furthermore, in order to align the focussing unit with the frame, the focussing unit is squeezed between the focussing unit holding member and transparent member. Accordingly, adhesive will not make the surface of the focussing unit dirty, a mount position displacement of the focussing unit to be caused by a variation in assembly works can be suppressed, and the image quality can be maintained without degrading its clearness.

Many widely different embodiment of the present invention may be constructed without departing from the spirit and scope of the present invention. It should be understood that the present invention is not limited to the specific embodiments described in the specification, except as defined in the appended claims.

What is claimed is:

1. A contact type image sensor comprising:
   (a) a transparent substrate having photosensors mounted thereon;
   (b) a focusing unit, disposed on said transparent substrate on a side opposite to a side where the photosensors are mounted, for focusing light from an original upon the photosensors; and
   (c) a frame for holding said transparent substrate and said focusing unit,
   wherein said transparent substrate has a light shielding layer and is not covered with the light shielding layer in an area corresponding to a focusing area of said focusing unit.

2. A contact type sensor according to claim 1, wherein said transparent substrate is not covered with the light shielding layer in an area corresponding to an area where the photosensors are mounted.

3. A contact type image sensor according to claim 2, wherein the light shielding layer is formed so that an area of the focusing area of said focusing unit becomes smaller than an area of light reception pixels of the photosensors.

4. A contact type image sensor according to claim 1, wherein said focusing unit is a rod lens.

5. An information processing apparatus comprising:
   a contact type image sensor for reading an original image and outputting an image signal;
   processing means for performing a predetermined process relative to the image signal output from said contact type image sensor; and
   control means for controlling said contact type image sensor and said processing means;
   wherein said contact type image sensor comprises:
   a transparent substrate having photosensors mounted thereof;
   a focusing unit, disposed on said transparent substrate on a side opposite to a side where the photosensors are mounted, for focusing light from an original upon the photosensors; and a frame for holding said transparent substrate and said focusing unit, wherein said transparent substrate has a light shielding layer and is not covered the light shielding layer in an area corresponding to a focusing area of said focusing unit.

6. An information processing apparatus according to claim 5, wherein said transparent substrate is not covered with the light shielding layer in an area corresponding to an area where the photosensors are mounted.

7. An information processing apparatus according to claim 6, wherein the light shielding layer is formed so that an area of the focusing area of said focusing unit becomes smaller than an area of light reception pixels of the photosensors.

8. An information processing apparatus according to claim 5, wherein said focusing unit is a rod lens.

9. An apparatus according to claim 5, further comprising a moving unit adapted to relatively move said original image and said contact type image sensor.

10. A contact type image sensor comprising:
    (a) photosensors;
    (b) a support member for supporting an original;
    (c) a focusing unit for focusing light from the original upon the photosensors;
    (d) a frame for holding said photosensors, said focusing unit, and said support member; and
    (e) a focusing unit holding member different from said support member and disposed between said support member and said focusing unit, for positioning said focusing unit relative to said frame in an optical path direction of said focusing unit and wherein a thickness in the optical path direction of said focusing unit holding member between said support member and said focusing unit is set so that an original support surface of said support member is positioned in a range of a depth of focus of said focusing unit, and said focusing unit holding member abuts on said support member and said focusing unit.

11. A contact type image sensor according to claim 10, wherein said focusing unit is inserted into a space between, and squeezed between, said focusing unit holding member and said frame.

12. A contact type image sensor according to claim 10, wherein said support member is fixed to said frame with adhesive.

13. A contact type image sensor according to claim 12, wherein said support member together with said focusing unit holding member is fixed to said frame with adhesive.

14. A contact type image sensor according to claim 10, wherein said focusing unit holding member is positioned outside of an opening angle of said focusing unit.

15. An information processing apparatus comprising:
    a contact type image sensor for reading an original image and outputting an image signal;
    processing means for performing a predetermined process relative to the image signal output from said contact type image sensor;
    control means for controlling said contact type image sensor and said processing means,
    wherein said contact type image sensor comprises:
    photo sensors;
    a support member for supporting an original;

a focusing unit for focusing light from the original upon the photosensors;

a frame for holding said photosensors, said focusing unit, and said support member; and a focusing unit holding member different from said support member and disposed between said support member and said focusing unit, for positioning said focusing unit relative to said frame in an optical path direction of said focusing unit and where in the optical path direction of said focusing unit is set so that an original support surface of said support member is positioned in a range of a depth of focus of said focusing unit, and said focusing unit holding member abuts on said support member and said focusing unit.

16. An information processing apparatus according to claim 15, wherein said focusing unit is inserted into a space between, and squeezed between, said focusing unit holding member and said frame.

17. An information processing apparatus according to claim 15, wherein said support member is fixed to said frame with adhesive.

18. An information processing apparatus according to claim 17, wherein said support member together with said focusing unit holding member is fixed to said frame with adhesive.

19. An information processing apparatus according to claim 15, wherein said focusing unit holding member is positioned outside of an opening angle of said focusing unit.

20. An apparatus according to claim 15, further comprising a moving unit adapted to relatively move said original image and said contact type image sensor.

* * * * *

UNITED STATES PATENT AND TRADEMARK OFFICE
CERTIFICATE OF CORRECTION

PATENT NO.     : 6,343,162 B1
DATED          : January 29, 2002
INVENTOR(S)    : Oji Saito et al.

It is certified that error appears in the above-identified patent and that said Letters Patent is hereby corrected as shown below:

Title page,
Item [56], FOREIGN PATENT DOCUMENTS,
"63303560" should read -- 63-303560 --;
"1089756" should read -- 1-089756 --;
"4135366" should read -- 4-135366 --; and
"4249470" should read -- 4-249470 --.

Item [57], ABSTRACT,
Line 4, "sensor-array" should read -- sensor array --;

Column 3,
Line 43, "sensor." should read -- sensor according to a sixth embodiment of the invention. --.

Column 6,
Line 37, "light-source" should read -- light source --; and
Line 42, "ingly" should read -- ing --.

Column 8,
Line 27, "frames 41" should read -- frame 41 --; and
Line 48, "member, 45" should read -- member 45 --; and
"to," should read -- to --.

Column 10,
Line 9, close up right margin;
Line 10, close up left margin;
Line 11, "units" should read -- unit --;
Line 35, "units" should read -- unit --; and
Line 57, "subject" should read -- subjected --.

Column 11,
Line 26, "embodiment" should read -- embodiments --;
Line 46, "sensor" should read -- image sensor --; and
Line 67, "thereof;" should read -- thereon; --.

UNITED STATES PATENT AND TRADEMARK OFFICE
CERTIFICATE OF CORRECTION

PATENT NO.    : 6,343,162 B1
DATED         : January 29, 2002
INVENTOR(S)   : Oji Saito et al.

It is certified that error appears in the above-identified patent and that said Letters Patent is hereby corrected as shown below:

<u>Column 12,</u>
Line 7, "covered" should read -- covered with --; and
Line 66, "photo sensors;" should read -- photosensors; --.

Signed and Sealed this

Fourteenth Day of January, 2003

JAMES E. ROGAN
*Director of the United States Patent and Trademark Office*